United States Patent
Toosky

(10) Patent No.: US 8,139,791 B1
(45) Date of Patent: Mar. 20, 2012

(54) GROUND REFERENCED AUDIO HEADPHONE AMPLIFIER WITH LOW STANDBY CURRENT

(75) Inventor: Zabiholah Toosky, Santa Cruz, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 1445 days.

(21) Appl. No.: 11/042,863

(22) Filed: Jan. 24, 2005

(51) Int. Cl.
*H03F 21/00* (2006.01)

(52) U.S. Cl. .......... 381/120; 381/74

(58) Field of Classification Search ........... 381/1, 120, 381/28, 74, 300, 309, 77, 123; 330/250, 330/251, 124 R, 295
See application file for complete search history.

(56) References Cited

U.S. PATENT DOCUMENTS

| | | | | |
|---|---|---|---|---|
| 5,161,198 A | * | 11/1992 | Noble | 381/81 |
| 5,255,324 A | * | 10/1993 | Brewer et al. | 381/107 |
| 5,818,299 A | * | 10/1998 | Tran | 330/149 |
| 6,069,960 A | * | 5/2000 | Mizukami et al. | 381/74 |
| 6,424,875 B1 | * | 7/2002 | Yoon | 700/94 |
| 7,038,499 B1 | * | 5/2006 | Toosky | 327/78 |
| 7,167,569 B1 | * | 1/2007 | Seven | 381/111 |
| 2004/0081099 A1 | * | 4/2004 | Patterson et al. | 370/241 |
| 2006/0122529 A1 | * | 6/2006 | Tsau | 600/544 |

OTHER PUBLICATIONS

LM 4917 Boomer—Ground-Referenced, 95mW Stereo Headphone Amplifier; Nov. 2004, National Semiconductor Corporation, pp. 1-18.*
80Mw, Fixed-Gain, DirectDrive, Stereo Headphone Amplifier with Shutdown, MAX4411, 2003, *Maxim Integrated Products*, pp. 1-18.
LM 4917 Boomer—Ground-Referenced, 95mW Stereo Headphone Amplifier; Nov. 2004, *National Semiconductor Corporation*, pp. 1-18.

* cited by examiner

*Primary Examiner* — Davetta W Goins
*Assistant Examiner* — Lun-See Lao

(57) ABSTRACT

A ground-referenced headphone amplifier includes left and right channel audio amplifiers, each including a standby mode trigger control input. A sense comparator circuit samples each audio input signal and, upon the detection of audio signals below a threshold voltage, the sense comparator supplies an indication of the low-level signal to a sense logic circuit. The sense logic circuit determines if the duration of the low-level signal is greater than a predetermined duration, and if so sends a control signal to the amplifiers to enter a standby mode. Once the low-level signal condition alleviates, the sense comparator indication changes, and the sense logic controls the amplifiers to exit the standby mode. During standby the ground-referenced headphone amplifier draws about 1.2 mA of power.

20 Claims, 5 Drawing Sheets

GROUND REFERENCED AUDIO HEADPHONE AMPLIFIER WITH LOW STANDBY CURRENT

FIELD OF THE INVENTION

The present invention relates to audio headphone amplifiers and, in particular, to ground-referenced audio headphone amplifiers.

BACKGROUND

Headphone amplifiers for modern personal audio devices (e.g., cell phones, CD, MiniDisc, MP3, DVD, etc.) usually have minimal size, are inexpensive, and consume little power. Typical headphone amplifiers implement a single-ended output configuration, which operate from a single supply that DC-biases the audio output at ½ Vdd. Thus, the output swings equally between the single-supply voltage and ground before the signal is clipped. Such headphones are AC-coupled through capacitors to prevent damage to its speakers caused by a DC current resulting from the bias voltage. However, the DC blocking capacitor needs to be large (200 µF) to prevent low frequency attenuation of the audio signal.

DETAILED DESCRIPTION OF THE ILLUSTRATIVE EMBODIMENTS

By way of overview and introduction, a ground-referenced headphone amplifier is presented. A ground-referenced headphone amplifier embodying the present invention includes an internal charge pump that generates Vss (negative supply voltage) from Vdd (positive power supply applied from an external source). This dual polarity supply allows for the virtual ground of the amplifier to be connected to actual ground, rather than at ½ Vdd. Because the headphone amplifier has a dual polarity bias, the audio output does not have a bias voltage. Thus, the need for large and costly output and bypass capacitors is eliminated. Not only does the low-frequency response improve, but also the Power Supply Rejection Ratio and Total Harmonic Distortion improve as well. A larger output signal results, which is desirable when driving piezo-electric or ceramic speakers.

Figure 1:
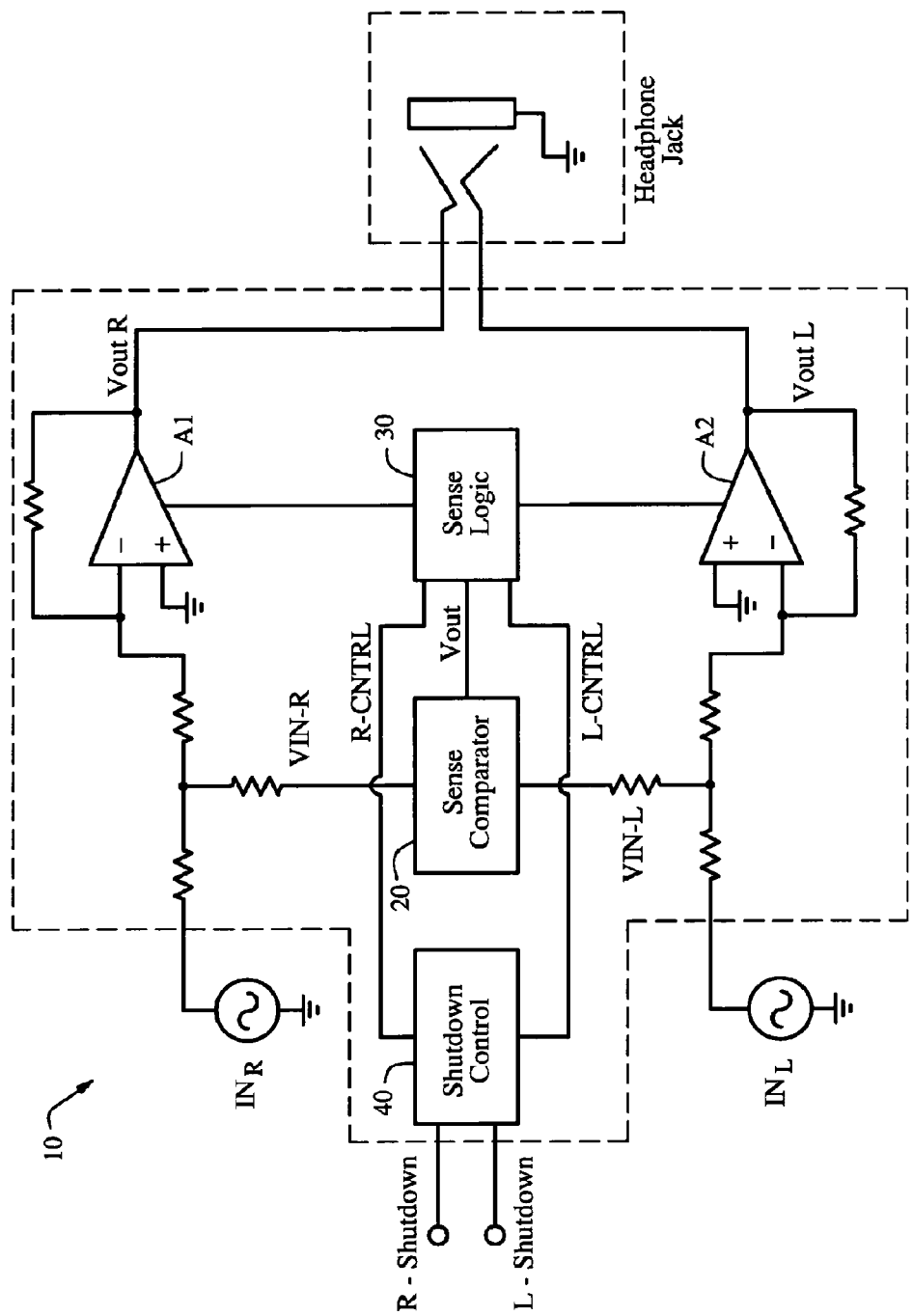
FIG. 1 illustrates a schematic diagram of one embodiment of a ground-referenced headphone amplifier.

FIG. 1 illustrates a schematic diagram of one embodiment of a ground-referenced headphone amplifier. The ground-referenced headphone amplifier 10 is implemented in CMOS technology and includes shutdown control 40 that permits independent right/left channel low-power control for flexibility during mono/stereo operation. The shutdown control 40 is activated by external digital logic signals R-Shutdown and L-Shutdown, which can be provided by a manual switch, or from a microprocessor or microcontroller. The R- and L-shutdown controls are independent of each other, and can be present singly or simultaneously. The shutdown control 40 also contains circuitry that eliminates output transients (i.e., "clicks" and "pops") during initial power-on, or when operation is resumed after coming out of a shutdown mode. Logic control signals R-cntrl and L-cntrl are provided by the shutdown control 40 to a sense logic circuit 30, described below, which acts to turn off one or both of amplifiers A1 and A2. In full shut down mode, the ground-referenced headphone amplifier 10 draws about 1.0 µA of power.

The ground-referenced headphone amplifier 10 of FIG. 1, further includes a sense comparator 20 that senses input audio signal levels and, if an input level is below a threshold for a predetermined period of time, is operable to indicate that the audio amplifiers A1, A2 are to be placed into a standby mode by sending a digital signal Vout to the sense logic circuit 30. In standby mode the ground-referenced headphone amplifier 10 draws about 1.2 mA of power, thus conserving battery power. The sense comparator 20 places the ground-referenced headphone amplifier into standby mode when there has been no signal above the threshold detection level for a predetermined period of time, e.g., twelve seconds.

Additionally, when the sense comparator 20 detects the presence of audio signal levels greater than the threshold level, Vout changes to indicate that the sense logic circuit 30 should remove the audio amplifiers A1, A2 from standby mode. By way of example, in the absence of an audio signal greater than about 2 mV peak—on either the left, right or both channels—and after the predetermined period of time, the amplifiers A1, A2 are turned off and the entire ground-referenced headphone amplifier 10 enters a low-power standby mode. In order for the sense comparator 20 to detect a small amplitude signal reliably, the design must overcome the process variations inherent in semiconductor fabrication and the ambient environmental conditions, all of which affect the random offsets of the circuit elements.

Empirical evidence from data involving a disperse age group has shown that any audio signal below about 2.0 mV into a 16 ohm speaker (i.e., 122 nW) is barely audible to most individuals. Critical to audibility is the amount of acoustic power that is generated by transformation of the electrical power. While a 2.0 mV signal into a 2 ohm speaker would be audible, a significant amount of headphones available in the market are 16 ohms or even 32 ohms. Thus, because this a ground-referenced amplifier, it is desirable to detect low level, positive signals. Offsets are inherent in any semiconductor process, and typically have a Gaussian random distribution about ground. Therefore, an intentional single-sided positive offset is added to the circuitry to raise the random offset above the ground level. For example, if a random offset has a level of −2.0 mV, and the intentional positive offset is +3.0 mV, the resulting offset is +1.0 mV.

Figure 2A:
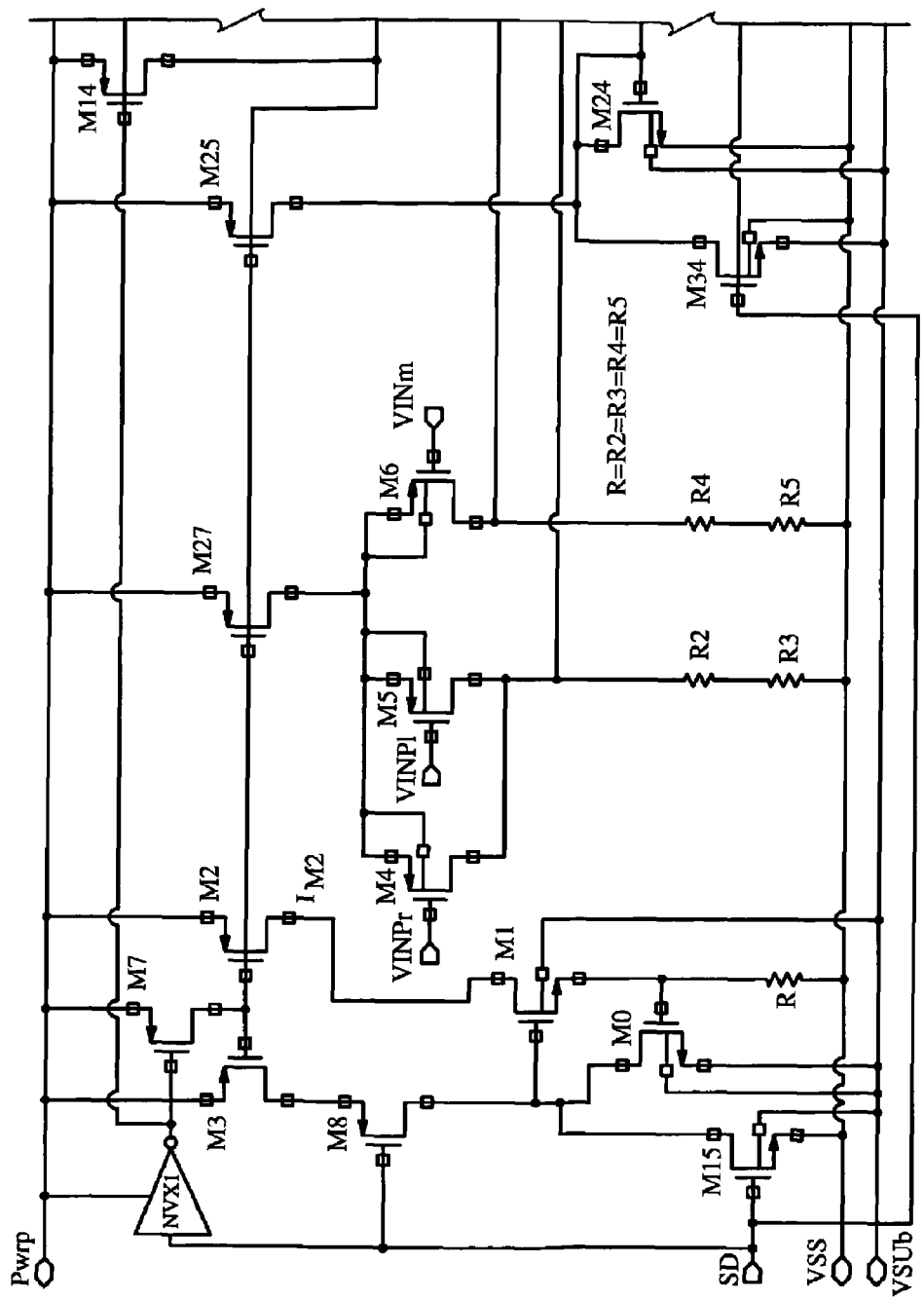
FIGS. 2a and 2b together are a schematic diagram illustrating an embodiment of a portion of the ground-referenced headphone amplifier of FIG. 1.
Figure 2B:
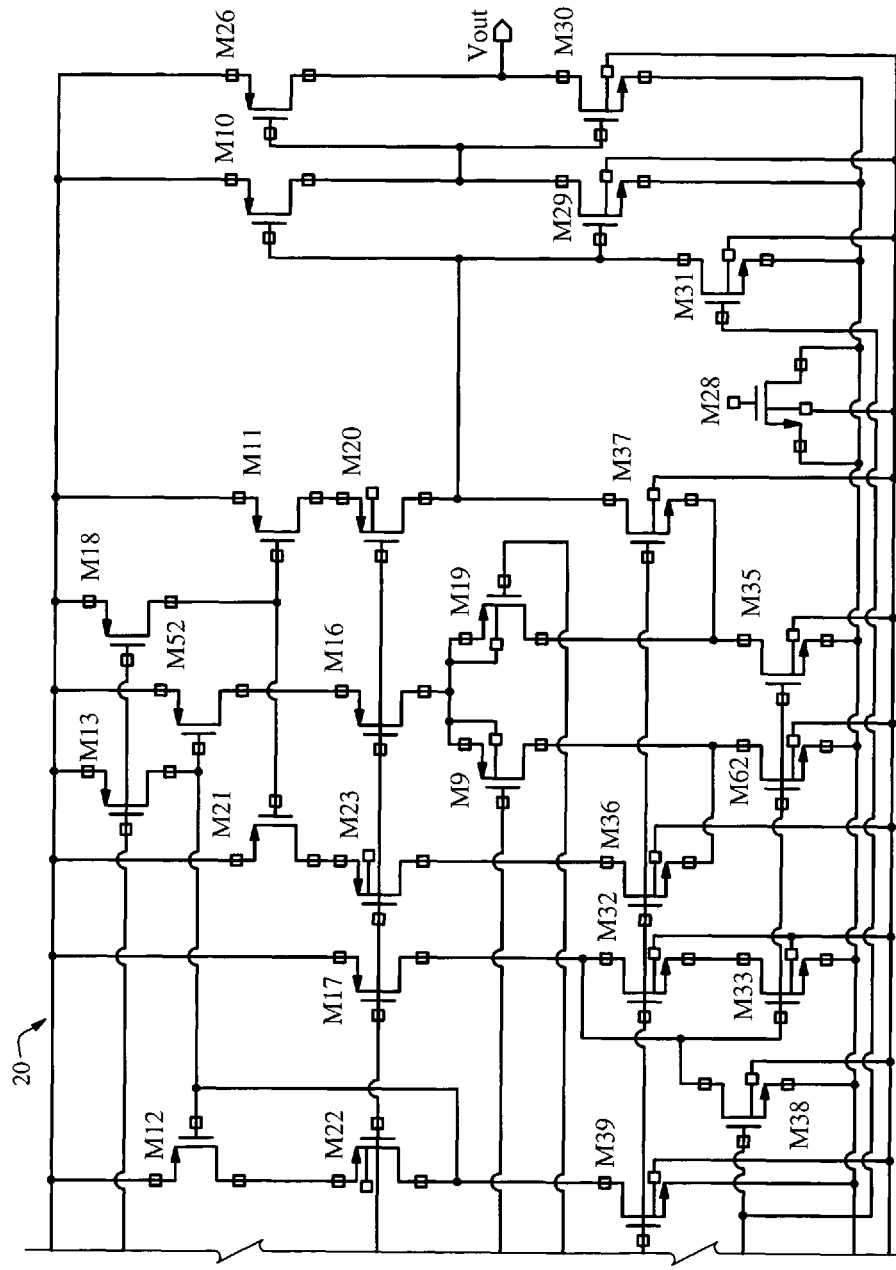

FIG. 2 is a schematic diagram illustrating an embodiment of the sense comparator 20. To overcome the random offsets due to process variation and environmental conditions, the sense comparator includes a two-stage design. The first stage 22 provides a gain of approximately 20 V/V, and it is designed to have less than about 2.0 mV of random offset at its 6-sigma value.

Transistors M0, M1, M2 and M3 form a bias circuit that provides a threshold voltage VTH referenced bias current Im2 for the entire circuit. VTH is the threshold voltage of the NMOS circuitry, nominally 1.0 Volts for this process. The current through the M0/M1 branch, Im2 is given by equation 1.

$$Im2 = \frac{VTHn}{2R} \quad \text{(Eq. 1)}$$

The first stage 22 of the sense comparator 20 has a topology designed to capture the lowest possible offset (e.g., 2.0 mV) that includes a PMOS differential gain block formed by input transistor pair M4, M5, transistor M6, and tail current transistor M27. The source of the tail current transistor M27 is connected to Vdd. The differential amplifier transistors M4, M5 and M6 are each drain connected to Vss through respective load resistors R2, R3, R4. The non-inverting side of the differential block is split between equal transistors M4, M5 to sum the right and left channel audio input signals VIN-R, VIN-L into the amplifier. The inverting input of the differential block, i.e., the gate of transistor M6, is grounded. The proper sizing and bias conditions for the input pair, as well as using unit resistors for the loads instead of current sources reduces the random offset of the first stage to less than 2.0 mV. The unit resistors are interlaced for better matching so that process-variation-temperature (PVT) affects are averaged to be negligible.

Transistors M2 and M27 form a current mirror having an input current of Im2. The output current of a current mirror is related to the input current in the same ratio as is the ratio of the current mirror's transistor transconductances, where the transconductance of each transistor depends upon the areas of its gate-source junction. Because the channel aspect ratio W/L of transistor M27 is 20 (e.g., 80µ/4µ) and the W/L of transistor M2 is 10 (e.g., 40µ/4µ), the current $I_{TAIL}$ through the tail current transistor M27 is twice that of current Im2.

The value of the load resistors R2, R3, R4 connected to the drains of the differential pair transistors M4, M5, M6 is four times greater than the value of resistor R of the bias circuit. Because current through half of a differential pair is one-half the input current, i.e., the tail current $I_{TAIL}$, the output common mode voltage $V_{CM}$ for the first stage 22 is given by equation 2.

$$Vcm = \frac{VTHn}{2R} \times 4R - Vss = 2VTHn - Vss \quad \text{(Eq. 2)}$$

The gain of the first stage amplifier is its transconductance (gm) (the ratio of current to saturation voltage) multiplied by four times the amplifiers load resistance value R. Equation 3 shows, by substitution, how the first stage gain is independent of resistance.

$$Gain = gm \times 4R = \frac{2Id}{Vdsat} \times 4R = \frac{2VTHn}{2R \times Vdsat} \times 4R = \frac{4VTHn}{Vdsat} \text{ or,} \quad \text{(Eq. 3)}$$

$$Gain = \left(\sqrt{2 \times Id \times \mu \times Cox \times (W1)/(L1)}\right)(4R) \quad \text{(Eq. 4)}$$

The output common mode voltage $V_{CM}$ for the first stage, as designed above, allows for the lowest value of Vdd operation. As can be seen from equations 2 and 3, both $V_{CM}$ and gain are independent of the resistor values. Thus, $V_{CM}$ and gain are stable over PVT affects. Further, $V_{CM}$ of the first stage can be close to ground.

The second stage 24 of sense comparator 20 supplies the remaining gain. The second stage 24 includes a differential amplifier, followed by a cascode amplifier, that feeds inverting amplifiers M10, M26 and M29 and M30 to obtain the final gain needed to assure that Vout has digital signal levels with sharp rise/fall times.

The differential amplifier 25 is formed from transistors M9 and M19. The loads for transistors M9 and M19 are constant current sources M62 and M35, where M62 and M35 have different transconductances. The aspect ratio for M62 is (70µ/5µ), and the aspect ratio for M35 is (98µ/5µ). The cascode amplifier is formed by NMOS transistors M36, M37, and opposite polarity PMOS transistors M23, M20.

Tail current for the differential amplifier 25 is supplied by transistor M16. Which is supplied by a current mirror formed by transistors M21 and M11 that derives its output from bias current Im2.

The constant current source loads M62, M35 provide the intentional one-sided offset described above. The gain of this stage results in a one-sided offset of 60 mV, which is reduced by the gain of the first stage 22 of 20 V/V to yield an offset of 3 mV. Because transconductance (gm) is derived from the output current over input voltage, the built-in offset voltage of the second stage is given by the difference of load current sources M62, M35 divided by the transconductance of the first stage 22 input differential amplifier pair. Therefore, the circuit as a whole is capable of canceling an average random offset of up to a negative 2.0 mV.

Because the loads M62, M35 are different transistors, the difference is made proportional to the bias current with a proportionality constant K, which is a ratio of current source and device sizes. The voltage offset Vos is a ratio of the difference in the currents Δi divided by the transconductance. Equation 4 indicates the ratio, and its reduction to a final form after substitutions have been made.

$$Vos = \frac{\Delta i}{gm} \frac{K \times \frac{VTHn}{R}}{\frac{VTHn}{R \times Vdsat}} = K \times Vdsat \text{ or,} \quad \text{(Eq. 5)}$$

$$Vos = \frac{\left(\frac{12}{40}\right)\left(\frac{98}{56} - \frac{70}{56}\right)(Id)}{\sqrt{2 \times Id \times \mu \times Cox \times (W2)/(L2)}} \quad \text{(Eq. 6)}$$

The saturation voltage Vdsat2 of the second stage input differential pair is made proportional to the saturation voltage Vdsat1 of the first stage 22 by scaling bias current and input pair device size. As can be seen from equation 4, the voltage offset for the second stage 24 is independent of resistance and, thus, independent of PVT variations.

The sense comparator circuitry 20 itself has an input-referenced one-sided offset voltage Voss that is derived from the built-in offset voltage of the second stage 24 divided by the gain of the first stage. This offset voltage Voss can be found by equation 5.

$$Voss = \frac{K \times Vdsat}{\frac{4VTHn}{Vdsat}} = \frac{K \times (Vdsat)^2}{4VTHn} \quad \text{(Eq. 7)}$$

$$Voss = \frac{\frac{0.15 \times Id}{\sqrt{2 \times Id \times \mu \times Cox(250/4)}}}{\left(\sqrt{2 \times Id \times \mu \times Cox(500/4)}\right)(4R)} = \frac{0.15}{\frac{2 \times \mu \times Cox \times 4R}{\sqrt{(250/4) \times (500/4)}}} \quad \text{(Eq. 8)}$$

Equation 8 shows that an input-referred offset voltage of the ground-referenced headphone amplifier 10 is a function of the basic semiconductor physics parameters of hole mobility and process oxide capacitance along with design component values for the unit resistor, which is selected to be 20 kOhms for an embodiment of the amplifier.

Where applicable, Equations 1-8 contain actual device dimensions. There are no simplifications nor any constants other than universal physics constants such as hole mobility and gate oxide per unit area. There are no rounding off of ratios. All numbers in the final equation are exact. These equations are presented in a form so that a person of ordinary skill in the art of semiconductor and analog IC design will be able to follow their derivation.

For this process the threshold voltage VTHn is nominally 1.0 Volt, and the saturation voltage is designed to be approximately 145.0 mV. Because, as described above, the constant K is the ratio of current sources and device sizes it is set to 0.57. These parameters result in a Voss for the entire circuit of approximately 3.0 mV.

The operation of the sense comparator 20 is made independent of PVT affects by the ratio of the first stage 22 and second stage 24 saturation voltages, which rely on the inherent square law behavior of the devices, as well as the use of unit resistors that are interlaced to provide better matching over PVT variations. Utilizing the ratio of the saturation voltages to create the offset voltage cancels out the PVT variations. Thus, the randomness of the silicon chip manufacturing process is removed. The result is a reliable detection scheme to sense the low level signals based on the threshold voltage and the aspect ratio of the devices.

Figure 3A:
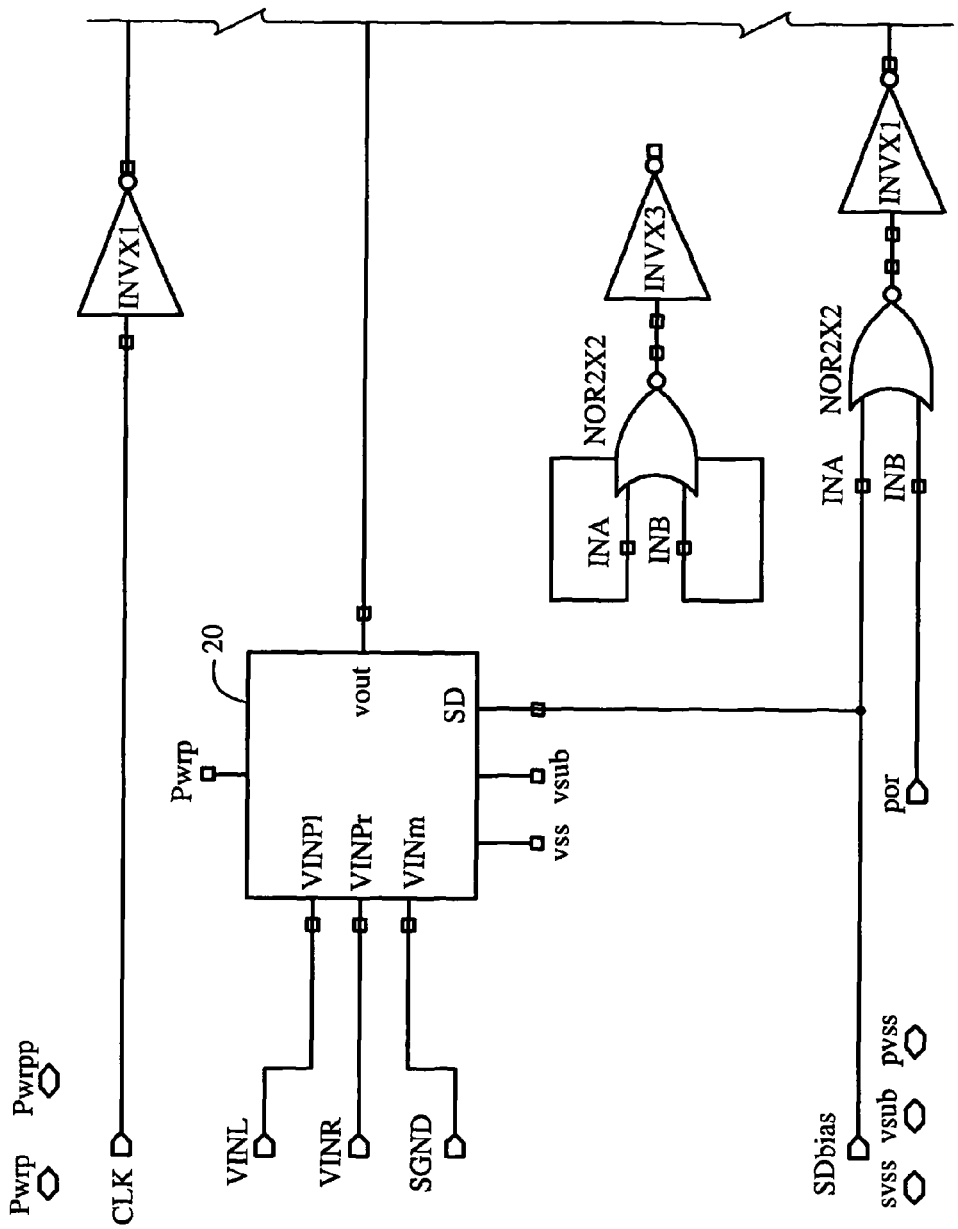
FIGS. 3a and 3b together are a schematic diagram illustrating an embodiment of another portion of the ground-referenced headphone amplifier of FIG. 1.
Figure 3B:
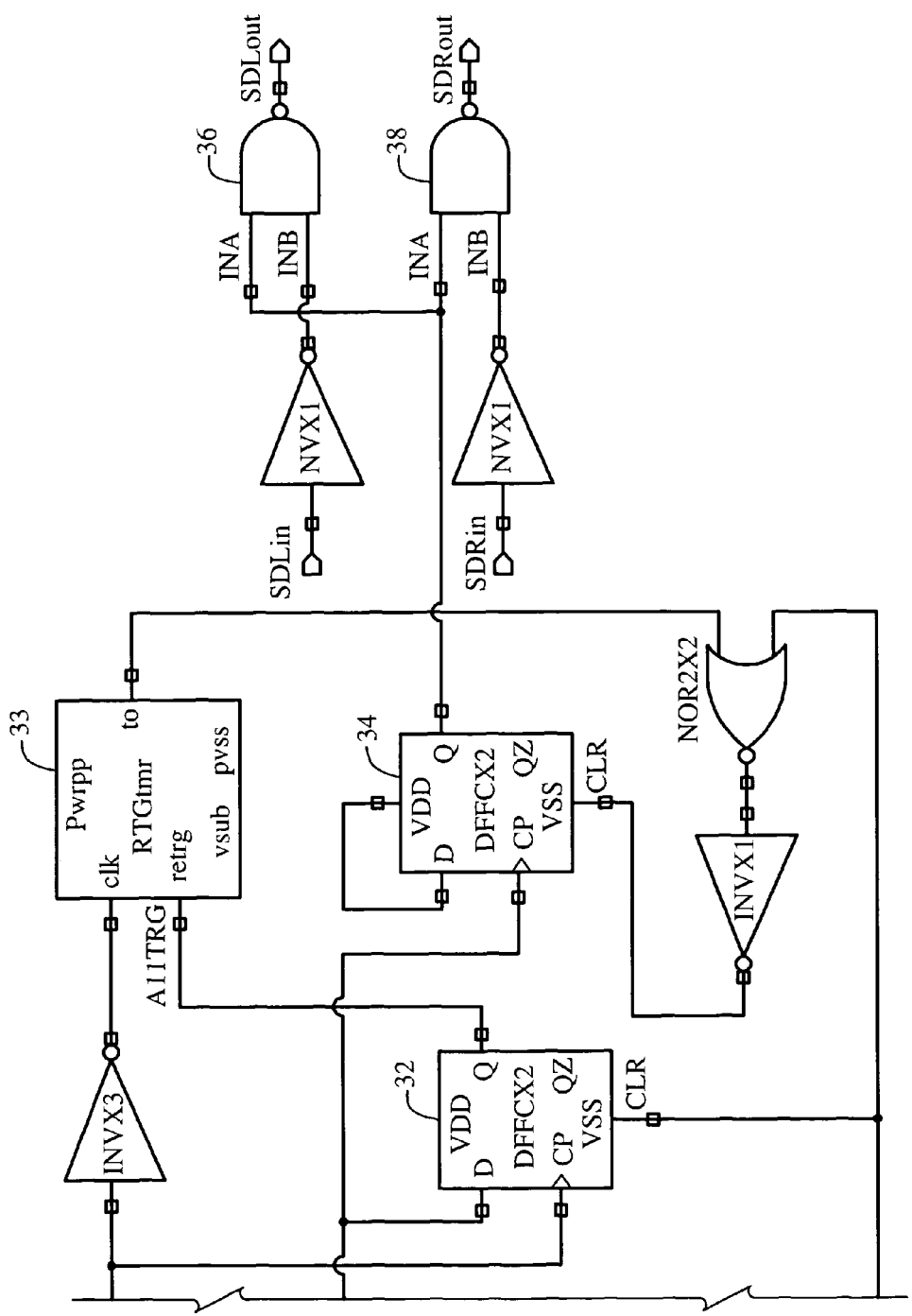

FIG. 3 is a schematic diagram illustrating an embodiment of the sense logic circuit 30. Depicted in FIG. 3 is the sense comparator 20, and the components of the sense logic circuit 30. The following discussion describes the sense logic embodiment shown in FIG. 3, but as will be apparent to persons of ordinary skill in the art, other logic configurations can be assembled to provide the same results. The invention is not so limited as to be only embodied by the circuits described herein.

The digital Vout signal from sense comparator 20 is provided to the D input of flip flop 32 and the clock input of flip flop 33. When audio signal input levels are detected by the sense comparator, Vout remains at a first logic level, and the Q output of flip flop 33 provides a constant logic level to the trigger input of timer 34. The data input for flip flop 34 is Vdd, thus the Q output will only change upon a clearing signal. The Q output of flip flop 34 is connected to NAND gates 36 and 38, which provide the standby signals to the amplifiers A1, A2.

When Vout changes to a second logic level, the Q output of flip flop 33 resets the time, which then starts timing out the twelve second delay before the amplifiers A1, A2 are placed into standby. Should Vout return to its first logic level prior to time out, the timer resets and begins to time out again. Should Vout remain at the second logic level, upon time-out the timer output clears flip flop 34. The Q output of flip flop 34 changes and a signal is generated by both NAND gates 36, 38, which causes the amplifiers to enter standby mode.

When Vout returns to the first logic level, the timer again receives a trigger, and subsequently clears flip flop 34. The NAND gates change output, and the amplifiers leave the standby mode.

The sense logic circuit is able to make a distinction between the standby mode and the shutdown mode. Flip flop 34 functions as a flag and stores the output state of the sense comparator 20. As previously described, when the audio signal is absent for the predetermined period of time (e.g., 12 seconds) the timer clears flip flop 34. Clearing flip flop 34 results in the output of the two NAND gates 36, 38 changing level and both amplifiers are turned off. In Shutdown mode the two Shutdown signals (Left and Right) have priority over the standby mode's predetermined delay. As soon as either of the shutdown signals is asserted, the corresponding amplifier is turned off immediately. If both shutdown signals are asserted, then the entire ground-referenced headphone amplifier integrated circuit is turned off. The integrated circuit enters into the shutdown mode and draws less than about 1.0 µA.

Under shutdown mode the entire ground-referenced headphone amplifier circuit (which includes Bias, Charge Pump, Thermal Shutdown, None-overlap clock generator, and Oscillator circuits) is turned off. However, under standby mode only the two amplifiers A1, A2 are turned off, while the remaining circuits remain ON for a fast return to active mode from standby mode. The return to active mode has a recovery time of less than about 1.0 µS. The return to active mode from shutdown mode has a recovery time of about 250 µS nominal.

Thus, while there have been shown, described, and pointed out fundamental novel features of the invention as applied to several embodiments, it will be understood that various omissions, substitutions, and changes in the form and details of the devices illustrated, and in their operation, may be made by those skilled in the art without departing from the spirit and scope of the invention. Substitutions of elements from one described embodiment to another are also fully intended and contemplated. It is also to be understood that the drawings are not necessarily drawn to scale, but that they are merely conceptual in nature. The invention is defined solely with regard to the claims appended hereto, and equivalents of the recitations therein.

I claim:

1. A ground-referenced headphone amplifier comprising:
   a first audio amplifier operable to receive a first audio input signal, the first audio amplifier including a standby mode trigger control input;
   a sense comparator circuit operable to sample the first audio input signal, the sense comparator circuit also operable to supply an indicator of a presence of audio input signal levels below a specified level; and
   a sense logic circuit operable to receive the indicator from the sense comparator circuit, the sense logic circuit in electrical connection with the standby mode trigger control input of the first audio amplifier;
   wherein the sense logic circuit is operable to monitor a duration of the indicator and, upon detecting the duration exceeding a predetermined amount of time, to provide a control signal to the first amplifier to enter a standby mode in which the first amplifier draws less current; and
   wherein the sense comparator circuit comprises first and second stages, the first stage configured to provide a first gain to reduce a random offset to less than a first offset value, the second stage configured to provide a second gain that, when combined with the first gain, provides a positive offset that is greater than the first offset value.

2. The ground-referenced headphone amplifier of claim 1, further comprising:
   a second audio amplifier operable to receive a second audio input signal;
   wherein:
     the second audio amplifier includes a second standby mode trigger control input;
     the first audio input signal is a left audio channel, and the second audio input signal is a right audio channel;
     the sense comparator circuit is further operable to sample the second audio input signal;
     the sense logic circuit is further in electrical connection with the second standby mode trigger control input of the second audio amplifier; and the sense logic circuit is operable to provide a second control signal to the second amplifier upon the duration exceeding the predetermined amount of time.

3. The ground-referenced headphone amplifier of claim 2, wherein the ground-referenced headphone amplifier is fabricated on a semiconductor wafer.

4. The ground-referenced headphone amplifier of claim 3, wherein the ground-referenced headphone amplifier is fabricated using CMOS technology.

5. The ground-referenced headphone amplifier of claim 2, wherein the headphone amplifier is operable to draw about 1.2 mA in the standby mode.

6. The ground-referenced headphone amplifier of claim 2, further comprising:
a shutdown control circuit with left and right channel inputs and left and right outputs, which are connected to the sense logic circuit;
wherein the left and right outputs are operable to provide signals that indicate to the sense logic circuit to control the first and second audio amplifiers to enter a shutdown mode.

7. The ground-referenced headphone amplifier of claim 6, wherein the headphone amplifier is operable to draw about 1.2 mA in the standby mode and to draw about 1.0 µA in the shutdown mode.

8. The ground-referenced headphone amplifier of claim 6, wherein the left and right channel inputs are operable to receive logic signals from at least one of: a manual switch, a microprocessor, and a microcontroller.

9. A system for amplifying an audio signal, the system comprising:
a ground-referenced headphone amplifier, the ground-referenced headphone amplifier comprising:
a first audio amplifier operable to receive a first audio input signal, the first audio amplifier including a standby mode trigger control input;
a sense comparator circuit operable to sample the first audio input signal, the sense comparator circuit also operable to supply an indicator of a presence of audio input signal levels below a specified level; and
a sense logic circuit operable to receive the indicator from the sense comparator circuit, the sense logic circuit in electrical connection with the standby mode trigger control input of the first audio amplifier;
wherein the sense logic circuit is operable to monitor a duration of the indicator and, upon detecting the duration exceeding a predetermined amount of time, to provide a control signal to the first amplifier to enter a standby mode in which the first amplifier draws less current; and
wherein the sense comparator circuit comprises first and second stages, the first stage configured to provide a first gain to reduce a random offset to less than a first offset value, the second stage configured to provide a second gain that, when combined with the first gain, provides a positive offset that is greater than the first offset value.

10. The system of claim 9, the ground-referenced headphone amplifier further comprising:
a second audio amplifier operable to receive a second audio input signal;
wherein:
the second audio amplifier includes a second standby mode trigger control input;
the first audio input signal is a left audio channel, and the second audio input signal is a right audio channel;
the sense comparator circuit is further operable to sample the second audio input signal;
the sense logic circuit is further in electrical connection with the second standby mode trigger control input of the second audio amplifier; and
the sense logic circuit is operable to provide a second control signal to the second amplifier upon the duration exceeding a predetermined amount of time.

11. The system of claim 10, wherein the ground-referenced headphone amplifier is fabricated on a semiconductor wafer.

12. The system of claim 11, wherein the ground-referenced headphone amplifier is fabricated using CMOS technology.

13. The system of claim 10, wherein the headphone amplifier is operable to draw about 1.2 mA in the standby mode.

14. The system of claim 10, the ground-referenced headphone amplifier further comprising:
a shutdown control circuit with left and right channel inputs and left and right outputs, which are connected to the sense logic circuit;
wherein the left and right outputs are operable to provide signals that indicate to the sense logic circuit to control the first and second audio amplifiers to enter a shutdown mode.

15. The system of claim 14, wherein the headphone amplifier is operable to draw about 1.2 mA in the standby mode and to draw about 1.0 µA in the shutdown mode.

16. The system of claim 14, wherein the left and right channel inputs are operable to receive logic signals from at least one of: a manual switch, a microprocessor, and a microcontroller.

17. A method for operating a ground-referenced headphone amplifier, the method comprising:
monitoring a first audio signal input to a first audio amplifier, the first audio amplifier including a standby mode trigger control input;
supplying an indicator if a level of an audio signal at the first audio signal input is below a specified level using a sense comparator;
monitoring a duration of the indicator;
providing, in a first stage of the sense comparator, a first gain to reduce a random offset to less than a first offset value;
providing, in a second stage of the sense comparator, a second gain;
combining the first gain and the second gain to provide a positive offset that is greater than the first offset value; and
upon detecting the duration exceeding a predetermined amount of time, placing the first audio amplifier in a standby mode in which the first amplifier draws less current.

18. The method of claim 17, wherein placing the first audio amplifier in the standby mode comprises providing a control signal to the first audio amplifier to enter the standby mode.

19. The method of claim 17, further comprising:
monitoring a second audio signal input to a second audio amplifier;
supplying a second indicator if a level of a second audio signal at the second audio signal input is below a second specified level;
determining a duration of the second indicator; and
upon the duration exceeding the predetermined amount of time, placing the second audio amplifier in the standby mode.

20. The method of claim 19, further comprising placing the first audio amplifier and the second audio amplifier in a shutdown mode.

* * * * *